(12) United States Patent
Nihei

(10) Patent No.: US 7,652,412 B2
(45) Date of Patent: Jan. 26, 2010

(54) PIEZOELECTRIC ACTUATOR, METHOD OF MANUFACTURING SAME, AND LIQUID EJECTION HEAD

(75) Inventor: Yasukazu Nihei, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 12/114,577

(22) Filed: May 2, 2008

(65) Prior Publication Data

US 2008/0238263 A1  Oct. 2, 2008

(51) Int. Cl.
*H01L 41/08* (2006.01)
(52) U.S. Cl. .................. 310/346; 310/328; 310/364
(58) Field of Classification Search ........... 310/324, 310/346
See application file for complete search history.

(56) References Cited

U.S. PATENT DOCUMENTS

| | | | | |
|---|---|---|---|---|
| 3,441,754 A | * | 4/1969 | Heny | 310/346 |
| 4,719,383 A | * | 1/1988 | Wang et al. | 310/324 |
| 4,825,117 A | * | 4/1989 | Thomas et al. | 310/346 |
| 5,376,860 A | * | 12/1994 | Sato | 310/346 |
| 5,691,594 A | | 11/1997 | Takeuchi et al. | |
| 6,402,303 B1 | | 6/2002 | Sumi | |
| 6,854,832 B2 | | 2/2005 | Matsuda | |
| 6,972,510 B2 | * | 12/2005 | Klee et al. | 310/324 |
| 7,276,994 B2 | * | 10/2007 | Takeuchi et al. | 333/189 |
| 2003/0189241 A1 | | 10/2003 | Kamada et al. | |
| 2005/0236710 A1 | | 10/2005 | Akiyama et al. | |

FOREIGN PATENT DOCUMENTS

| JP | 2003-136714 A | 5/2003 |
|---|---|---|
| JP | 2003-309299 A | 10/2003 |

* cited by examiner

*Primary Examiner*—Mark Budd
(74) *Attorney, Agent, or Firm*—Birch, Stewart, Kolasch & Birch, LLP

(57) ABSTRACT

The piezoelectric actuator comprises: a supporting substrate; a thermal stress controlling layer which is formed on the supporting substrate; and a piezoelectric body which is formed as a film onto the thermal stress controlling layer on the supporting substrate at a higher temperature than room temperature, wherein the thermal stress controlling layer reduces a film stress induced by formation of the piezoelectric body.

46 Claims, 13 Drawing Sheets

DIMENSIONS OF PIEZOELECTRIC BODY: 300 μm SQUARE
PIEZOELECTRIC CONSTANT: 250 pm/V

PIEZOELECTRIC ACTUATOR, METHOD OF MANUFACTURING SAME, AND LIQUID EJECTION HEAD

BACKGROUND OF THE INVENTION

1. Field of the Invention

The present invention relates to a piezoelectric actuator, a method of manufacturing same, and a liquid ejection head, and more particularly to technologies that can reduce a thermal stress induced by film formation of a piezoelectric body.

2. Description of the Related Art

Conventionally, the principal method of manufacturing an inkjet head is a method which involves bonding a bulk polished piezoelectric body member (made of lead zirconate titanate $(Pb(ZrTi)O_3)$(PZT), for example) and a calcined green sheet, to a diaphragm plate, by means of an adhesive. In this case, there is no need to take account of thermal stress in the piezoelectric body.

Furthermore, in a method of manufacturing inkjet head described in Japanese Patent Application Publication No. 2003-309299, a piezoelectric film is grown epitaxially on an epitaxial substrate, a silicon substrate is bonded directly to the opposite side of the piezoelectric film, and then the epitaxial substrate is separated from the piezoelectric film. In this case, the thermal stress induced on the boundary between the piezoelectric film and the epitaxial substrate by the formation of the piezoelectric film can be eliminated by removing the epitaxial substrate.

Moreover, recently, it is necessary to form the piezoelectric body as a thin film in accordance with increasing density in inkjet heads. Therefore, there are various examples that a piezoelectric body is formed on a diaphragm plate by the sputtering method.

On the other hand, recently, in the field of micro electrical mechanical systems (MEMS), technologies are suggested that elements such as sensors and actuators are integrated in yet higher levels by using piezoelectric ceramic, and are forming films on those elements in order to achieve practical use. An aerosol deposition method receives attention in those technologies, which is known as a film formation technique for use with ceramics, metals, and the like.

The aerosol deposition method is a method in which an aerosol is generated from a powder of raw material, the aerosol is sprayed onto a substrate, and a film is formed by deposition of the powdered material due to its impact energy. It is also called a "spray volume method" or a "gas deposition volume method".

When manufacturing a liquid ejection head, such as an inkjet head, it is proposed that a piezoelectric body and the like may be formed by the aerosol deposition method described above (see Japanese Patent Application Publication No. 2003-136714).

The film thickness of a piezoelectric body formed by the sputtering method on a diaphragm is approximately 3 μm. Therefore, since the film is thin, it does not give rise to notable deformation of the diaphragm even if there is stress in the film. Hence, no particular importance is attached to controlling stress in the film.

On the other hand, if a piezoelectric body or the like is formed by the aerosol deposition method, as described in Japanese Patent Application Publication No. 2003-136714, a strong compressive stress acts in the aerosol deposition film which has a fine structure, and the temperature during aerosol deposition film formation is approximately 600° C. Therefore, thermal stress acts on the film after film formation due to the difference between thermal expansion coefficients of the piezoelectric body and the diaphragm, and in particular, when the film is formed on a thin diaphragm having a thickness of 30 μm or less, then the diaphragm deforms due to the stress. Furthermore, if the film thickness of the piezoelectric body is 1 μm or more, and more particularly, approximately 10 μm, then the deformation due to stress in the film occurs remarkably.

FIG. 13A shows an ideal state in which there is no film stress in a piezoelectric body 2 formed on a diaphragm 1, so that there is no deformation of the diaphragm 1. FIG. 13B shows a state where a compressive stress acts on the piezoelectric body 2, so that the diaphragm 1 deforms unevenly due to the stress.

When stress deformation occurs in the diaphragm 1 as shown in FIG. 13B, there are following problems.

(1) Since a gap arises when the diaphragm 1 is bonded to the ink chamber partitions 3, the following problems arise, consequently.

a) Since the ink chambers 4 cannot be divided by the ink chamber partitions 3, then there is movement of ink between adjacently positioned ink chambers 4, and ink may gather in the gaps, thereby making it impossible to control the volume of ink that is ejected from the nozzles.

b) Since regions where the diaphragm 1 is not fixed to the ink chamber partitions 3 arise, then variations occur in the displacement volume and torque, and hence image defects arise due to non-uniformities in ink ejection throughout the surface.

c) Since the diaphragm 1 and the ink chamber partitions 3 can not be reliably fixed by bonding, then long-term durability cannot be guaranteed.

(2) Since deformation occurs in the diaphragm 1, then the volume of the ink chamber 4 varies, and variation may arise in the ejected ink volume even if the diaphragm 1 is driven at the same displacement volume, whereby image defects may occur due to non-uniformities in ink ejection throughout the surface.

(3) When deformation occurs in the diaphragm 1, sufficient alignment accuracy is not obtained in the subsequent process of wiring to the electrodes for driving the piezoelectric bodies 2, whereby wiring defects arise.

SUMMARY OF THE INVENTION

The present invention was devised in view of the aforementioned circumstances, an object thereof being to provide a piezoelectric actuator, a method of manufacturing same, and a liquid ejection head that can reduce either the film stress in piezoelectric bodies formed onto a supporting substrate and the deformation of the supporting substrate, without restricting the material of the support substrate.

In order to attain the aforementioned object, the present invention is directed to a piezoelectric actuator comprising: a supporting substrate; a thermal stress controlling layer which is formed on the supporting substrate; and a piezoelectric body which is formed as a film onto the thermal stress controlling layer on the supporting substrate at a higher temperature than room temperature, wherein the thermal stress controlling layer reduces a film stress induced by formation of the piezoelectric body.

In the case in which no thermal stress controlling layer is interposed between the supporting substrate and the piezoelectric body, a thermal stress acts on the piezoelectric body when the piezoelectric body returns to normal temperature after film formation of the piezoelectric body, due to the difference between thermal expansion coefficients of the supporting substrate and the piezoelectric body, and the temperature difference between normal temperature and a temperature during film formation. In this case, a stress (compressive stress) also acts on the actual piezoelectric body. However, according to the present invention, since the thermal stress controlling layer is interposed, then the film stress in the piezoelectric body is reduced, and deformation of the supporting substrate is suppressed. Incidentally, it is considered that the stress of the piezoelectric body can be reduced by selecting a supporting substrate having a thermal expansion coefficient which is close to the thermal expansion coefficient of the piezoelectric body, but in this case, a restriction is placed on the thermal expansion coefficient of the supporting substrate, in addition to the durability, processability, and vibration characteristics (such as Young's modulus) of the supporting substrate. The present invention can increase choice flexibility of materials which can be used as the supporting substrate, without restricting the thermal expansion coefficient of the supporting substrate.

The present invention is also directed to the piezoelectric actuator wherein: the thermal stress controlling layer has a thermal expansion coefficient which is selected according to a first thermal expansion coefficient and a second thermal expansion coefficient, the first thermal expansion coefficient being a thermal expansion coefficient of piezoelectric body, the second thermal expansion coefficient being a thermal expansion coefficient of the supporting substrate. In other words, the layer having a thermal expansion coefficient which can reduce thermal stress of the piezoelectric body is selected as the thermal stress controlling layer.

The present invention is also directed to the piezoelectric actuator wherein: when the second thermal expansion coefficient is higher than the first thermal expansion coefficient, the thermal stress controlling layer has a thermal expansion coefficient which is lower than the second thermal expansion coefficient. Therefore, it is possible to decrease a difference between thermal expansion coefficients of the piezoelectric body and the thermal stress controlling layer on the supporting substrate.

The present invention is also directed to the piezoelectric actuator wherein: when the second thermal expansion coefficient is higher than the first thermal expansion coefficient, the thermal stress controlling layer has a thermal expansion coefficient which is lower than the first thermal expansion coefficient. According to the present invention, it is possible to allow the thermal stress controlling layer to cancel out the true stress in the piezoelectric film and the thermal stress.

The present invention is also directed to the piezoelectric actuator wherein: when the second thermal expansion coefficient is lower than the first thermal expansion coefficient the thermal stress controlling layer has a thermal expansion coefficient which is higher than the second thermal expansion coefficient. Accordingly, it is possible to decrease a difference between thermal expansion coefficients of the piezoelectric body and the thermal stress controlling layer on the supporting substrate.

The present invention is also directed to the piezoelectric actuator wherein: when the second thermal expansion coefficient is lower than the first thermal expansion coefficient, the thermal stress controlling layer has a thermal expansion coefficient which is higher than the first thermal expansion coefficient. Accordingly, it is possible to allow the thermal stress controlling layer to cancel out the true stress in the piezoelectric film and the thermal stress.

The present invention is also directed to the piezoelectric actuator wherein the thermal stress controlling layer has a prescribed thickness required for reducing a thermal stress remaining in the piezoelectric body. As a thickness of the thermal stress controlling layer increases, the thermal expansion coefficient of the thermal stress controlling layer is more dominant than the thermal expansion coefficient of the supporting substrate.

The present invention is also directed to the piezoelectric actuator wherein the thermal stress controlling layer also serves as an electrode for driving the piezoelectric body.

The present invention is also directed to the piezoelectric actuator wherein an electrode which drives the piezoelectric body is formed between the thermal stress controlling layer and the piezoelectric body. This electrode can account for a part of the thermal stress controlling layer, depending on the thickness thereof.

The present invention is also directed to the piezoelectric actuator wherein a thickness of the supporting substrate is 30 µm or less.

The present invention is also directed to the piezoelectric actuator wherein a thickness of the piezoelectric body is 1 µm or greater.

More specifically, in a piezoelectric actuator for achieving a piezoelectric inkjet head having a high precision and a high-torque, it is important that a thick film of piezoelectric body of 1 µm or greater (preferably, approximately 10 g/m) be formed directly onto a thin supporting substrate (diaphragm) having a thickness of 30 µm or less (preferably, approximately 15 µm).

The present invention is also directed to the piezoelectric actuator wherein the piezoelectric body is formed by an aerosol deposition method. Since the piezoelectric body is formed by the aerosol deposition method, it is possible to form the piezoelectric body having a thickness which can not be formed by the spattering method, for example.

The present invention is also directed to the piezoelectric actuator wherein: the piezoelectric body formed by the aerosol deposition method is a PZT piezoelectric film; and a crystal a-axis length of the PZT piezoelectric film is in the range of 2.025 to 2.040 Angstroms. When the crystal a-axis length of the PZT piezoelectric film is in the range of 2.025 to 2.040 Angstroms, it is possible to prevent the supporting substrate from being deformed largely by the film stress in the PZT piezoelectric film.

The present invention is also directed to the piezoelectric actuator wherein the thermal stress controlling layer is formed by at least one of a sputtering method, a plating method, and an aerosol deposition method. When the thermal stress controlling layer is formed by the aerosol deposition method, it is necessary to reduce the film stress in the thermal stress controlling layer. In order to reduce the film stress, for example, the thermal stress controlling layer is formed not to have a fine structure, such as a piezoelectric film, or the film thickness and the materials for the thermal stress controlling layer are chosen.

The present invention is also directed to the piezoelectric actuator wherein: the supporting substrate is made of stabilized zirconia; and the thermal stress controlling layer is made of platinum having a thickness of 2 to 5 µm. Generally, platinum has a thickness of 100 nm for forming the electrode, but the platinum thickness of 2 to 5 µm is needed for having function of the thermal stress controlling layer. The thermal stress controlling layer having a thickness in this range can be formed by the aerosol deposition method.

The present invention is also directed to the piezoelectric actuator wherein: the supporting substrate is made of stabilized zirconia; and the thermal stress controlling layer is made of iridium having a thickness of 1 to 5 µm. Since a thermal expansion coefficient of iridium is smaller than that of platinum, then the thermal stress controlling layer of iridium can have a thinner thickness than the thermal stress controlling layer of platinum.

The present invention is also directed to the piezoelectric actuator wherein: the supporting substrate is made of silicon; and the thermal stress controlling layer is made of platinum having a thickness of 10 μm or less.

The present invention is also directed to the piezoelectric actuator wherein: the supporting substrate is made of silicon; and the thermal stress controlling layer is made of nickel having a thickness of 1 to 5 μm.

The present invention is also directed to the piezoelectric actuator wherein: the supporting substrate is made of silicon; and the thermal stress controlling layer is made of titanium oxide having a thickness of 2 to 5 μm. Since a thermal expansion coefficient of titanium oxide is smaller than that of nickel, then the thermal stress controlling layer of titanium oxide is thicker than the thermal stress controlling layer of nickel.

In order to attain the aforementioned object, the present invention is directed to a liquid ejection head comprising: a pressure chamber which fills with a liquid; a nozzle which ejects the liquid from the pressure chamber; and a piezoelectric actuator which comprises a supporting substrate; a thermal stress controlling layer which is formed on the supporting substrate; and a piezoelectric body which is formed as a film onto the thermal stress controlling layer on the supporting substrate at a higher temperature than room temperature, wherein the thermal stress controlling layer reduces a film stress induced by formation of the piezoelectric body; and the supporting substrate is a diaphragm in which the liquid is ejected from the nozzle by changing a volume of the pressure chamber.

The present invention is also directed to the liquid ejection head wherein: the thermal stress controlling layer has a thermal expansion coefficient which is selected according to a first thermal expansion coefficient and a second thermal expansion coefficient, the first thermal expansion coefficient being a thermal expansion coefficient of piezoelectric body, the second thermal expansion coefficient being a thermal expansion coefficient of the supporting substrate.

The present invention is also directed to the liquid ejection head wherein: when the second thermal expansion coefficient is higher than the first thermal expansion coefficient, the thermal stress controlling layer has a thermal expansion coefficient which is lower than the second thermal expansion coefficient.

The present invention is also directed to the liquid ejection head wherein: when the second thermal expansion coefficient is higher than the first thermal expansion coefficient, the thermal stress controlling layer has a thermal expansion coefficient which is lower than the first thermal expansion coefficient.

The present invention is also directed to the liquid ejection head wherein: when the second thermal expansion coefficient is lower than the first thermal expansion coefficient, the thermal stress controlling layer has a thermal expansion coefficient which is higher than the second thermal expansion coefficient.

The present invention is also directed to the liquid ejection head wherein: when the second thermal expansion coefficient is lower than the first thermal expansion coefficient, the thermal stress controlling layer has a thermal expansion coefficient which is higher than the first thermal expansion coefficient.

The present invention is also directed to the liquid ejection head wherein the thermal stress controlling layer has a prescribed thickness required for reducing a thermal stress remaining in the piezoelectric body.

The present invention is also directed to the liquid ejection head wherein the thermal stress controlling layer also serves as an electrode for driving the piezoelectric body.

The present invention is also directed to the liquid ejection head wherein an electrode for driving the piezoelectric body is formed between the thermal stress controlling layer and the piezoelectric body.

The present invention is also directed to the liquid ejection head wherein a thickness of the supporting substrate is 30 μm or less.

The present invention is also directed to the liquid ejection head wherein a thickness of the piezoelectric body is 1 μm or greater.

The present invention is also directed to the liquid ejection head wherein the piezoelectric body is formed by an aerosol deposition method.

The present invention is also directed to the liquid ejection head wherein: the piezoelectric body formed by the aerosol deposition method is a PZT piezoelectric film; and a crystal a-axis length of the PZT piezoelectric film is in the range of 2.025 to 2.040 Angstroms.

The present invention is also directed to the liquid ejection head wherein the thermal stress controlling layer is formed by at least one of a sputtering method, a plating method, and an aerosol deposition method.

The present invention is also directed to the liquid ejection head wherein: the supporting substrate is made of stabilized zirconia; and the thermal stress controlling layer is made of platinum having a thickness of 2 to 5 μm.

The present invention is also directed to the liquid ejection head wherein: the supporting substrate is made of stabilized zirconia; and the thermal stress controlling layer is made of iridium having a thickness of 1 to 5 μm.

The present invention is also directed to the liquid ejection head wherein: the supporting substrate is made of silicon; and the thermal stress controlling layer is made of platinum having a thickness of 10 μm or less.

The present invention is also directed to the liquid ejection head wherein: the supporting substrate is made of silicon; and the thermal stress controlling layer is made of nickel having a thickness of 1 to 5 μm.

The present invention is also directed to the liquid ejection head wherein: the supporting substrate is made of silicon; and the thermal stress controlling layer is made of titanium oxide having a thickness of 2 to 5 μm.

According to the present invention, the liquid ejection head can achieve a high precision and a high-torque.

The present invention is directed to a method of manufacturing a piezoelectric actuator comprising the steps of: forming a thermal stress controlling layer on a supporting substrate; and forming a piezoelectric film by an aerosol deposition method in which an aerosol containing a powder of a piezoelectric material is sprayed onto the thermal stress controlling layer to accumulate the powder onto the thermal stress controlling layer, wherein the thermal stress controlling layer is formed in the step of forming the thermal stress controlling layer so as to have a thermal expansion coefficient and a thickness for reducing deformation of the supporting substrate due to thermal stress in the piezoelectric film.

According to the present invention, since a stress control layer is formed between the supporting substrate and the piezoelectric body formed directly on the supporting substrate, it is possible to reduce the film stress in the piezoelectric body formed on the supporting substrate, and hence, deformation of the supporting substrate can be suppressed.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DETAILED DESCRIPTION OF THE PREFERRED EMBODIMENTS

General Composition of Inkjet Recording Apparatus

Firstly, a general composition of an inkjet recording apparatus having a liquid ejection head according to the present invention will be described below.

Figure 1:
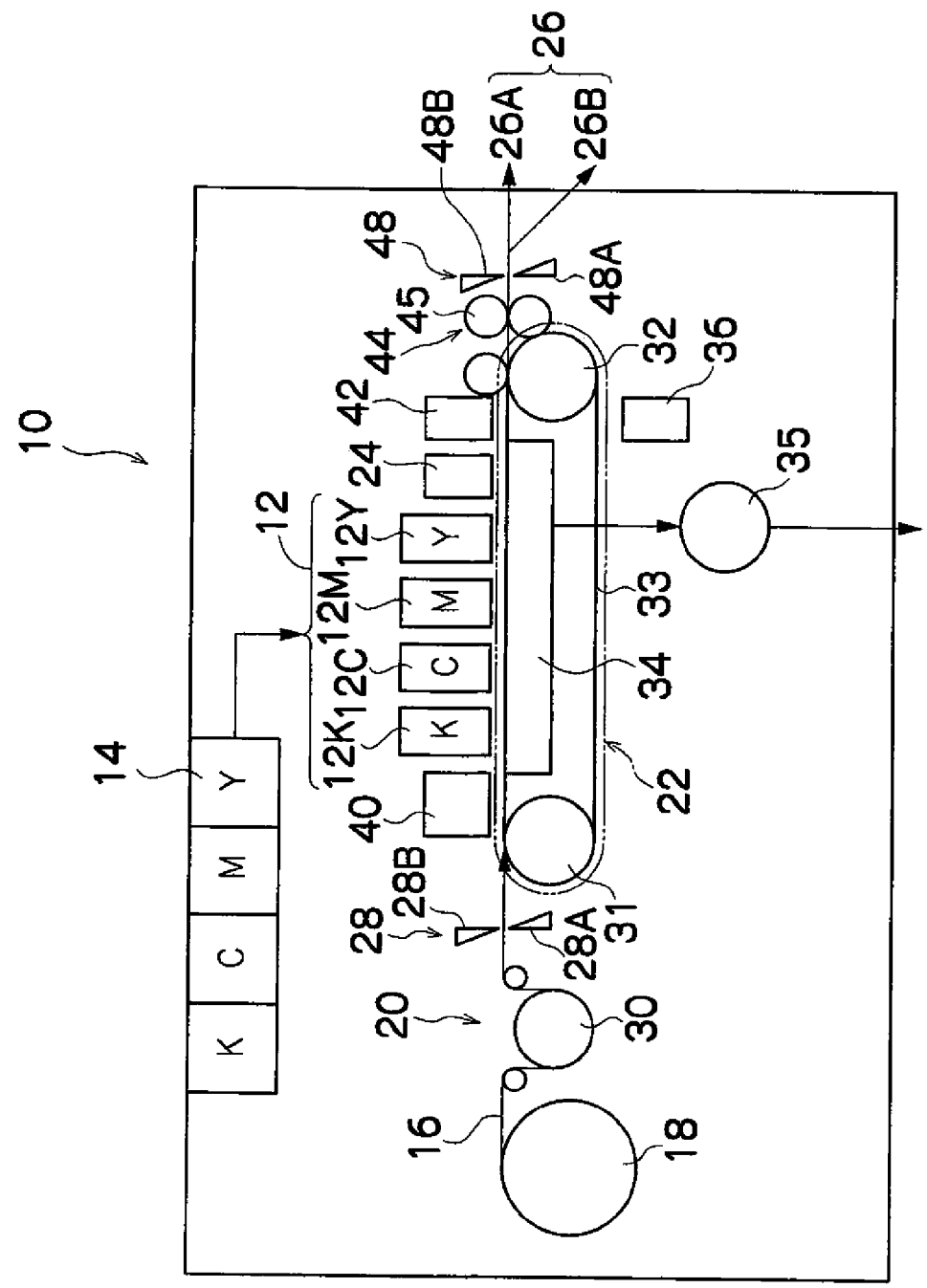
FIG. 1 is a general schematic drawing of an inkjet recording apparatus according to an embodiment of the present invention.

FIG. 1 is a general schematic diagram showing general composition of the inkjet recording apparatus according to an embodiment of the present invention. As shown in FIG. 1, the inkjet recording apparatus 10 comprises: a printing unit 12 having a plurality of liquid ejection heads (hereinafter simply called "head") 12K, 12C, 12M, and 12Y for ink colors of black (K), cyan (C), magenta (M), and yellow (Y), respectively; an ink storing and loading unit 14 for storing inks of K, C, M and Y to be supplied to the heads 12K, 12C, 12M, and 12Y; a paper supply unit 18 for supplying a recording paper 16; a decurling unit 20 for removing curl in the recording paper 16; a suction belt conveyance unit 22 disposed facing the nozzle face (ink-droplet ejection face) of the printing unit 12, for conveying the recording paper 16 while keeping the recording paper 16 flat; a print determination unit 24 for reading the printed result produced by the printing unit 12; and a paper output unit 26 for outputting image-printed recording paper 16 (printed matter) to the exterior.

The recording paper 16 delivered from the paper supply unit 18 retains curl due to having been loaded in the magazine. In order to remove the curl, heat is applied to the is recording paper 16 in the decurling unit 20 by a heating drum 30 in the direction opposite from the curl direction in the magazine.

In the case of the configuration in which roll paper is used, a cutter (first cutter) 28 is provided as shown in FIG. 1, and the continuous paper is cut into a desired size by the cutter 28. The cutter 28 has a stationary blade 28A, of which length is not less than the width of the conveyor pathway of the recording paper 16, and a round blade 28B, which moves along the stationary blade 28A. The stationary blade 28A is disposed on the reverse side of the printed surface of the recording paper 16, and the round blade 28B is disposed on the printed surface side across the conveyor pathway. When cut papers are used, the cutter 28 is not required.

The decurled and cut recording paper 16 is delivered to the suction belt conveyance unit 22. The suction belt conveyance unit 22 has a configuration in which an endless belt 33 is set around rollers 31 and 32 so that the portion of the endless belt 33 facing at least the nozzle face of the printing unit 12 and the sensor face of the print determination unit 24 forms a horizontal plane (flat plane).

The belt 33 has a width that is greater than the width of the recording paper 16, and a plurality of suction apertures (not shown) are formed on the belt surface. A suction chamber 34 is disposed in a position facing the sensor surface of the print determination unit 24 and the nozzle surface of the printing unit 12 on the interior side of the belt 33, which is set around the rollers 31 and 32, as shown in FIG. 1. The suction chamber 34 provides suction with a fan 35 to generate a negative pressure, and the recording paper 16 on the belt 33 is held by suction.

The belt 33 is driven in the clockwise direction in FIG. 1 by the motive force of a motor (not shown) being transmitted to at least one of the rollers 31 and 32, which the belt 33 is set around, and the recording paper 16 held on the belt 33 is conveyed from left to right in FIG. 1.

Since ink adheres to the belt 33 when a marginless print job or the like is performed, a belt-cleaning unit 36 is disposed in a predetermined position (a suitable position outside the printing area) on the exterior side of the belt 33.

A heating fan 40 is disposed on the upstream side of the printing unit 12 in the conveyance pathway formed by the suction belt conveyance unit 22. The heating fan 40 blows heated air onto the recording paper 16 to heat the recording paper 16 immediately before printing so that the ink deposited on the recording paper 16 dries more easily.

Figure 2:
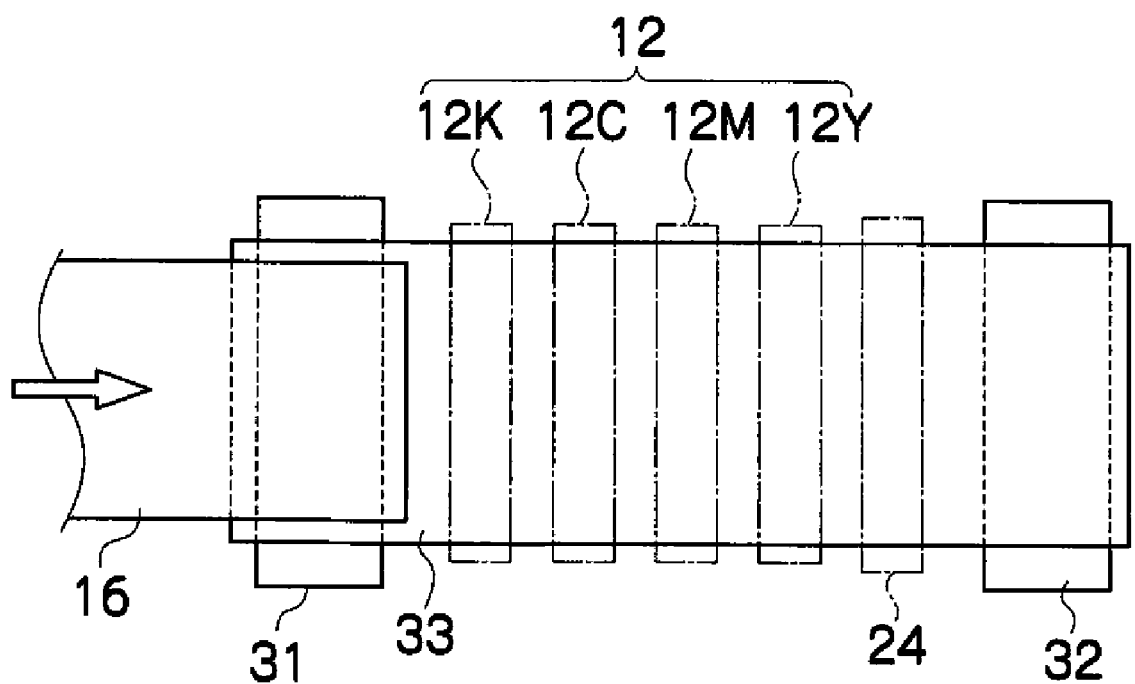
FIG. 2 is a plan view of the principal components in the peripheral area of a printing unit in the inkjet recording apparatus shown in FIG. 1.

The printing unit 12 is a so-called "fill line head" in which a line head having a length corresponding to the maximum paper width is arranged in a direction (main scanning direction) that is perpendicular to the paper feed direction (see FIG. 2). Each of the heads 12K, 12C, 12M, and 12Y is constituted by a line head, in which a plurality of ink ejection ports (nozzles) are arranged along a length that exceeds at least one side of the maximum-size recording paper 16 intended for use in the inkjet recording apparatus 10, as shown in FIG. 2.

The heads 12K, 12C, 12M, and 12Y are arranged in the order of black (K), cyan (C), magenta (M)) and yellow (Y) from the upstream side, along the feed direction of the recording paper 16. A color image can be formed on the recording paper 16 by ejecting the inks from the heads 12K, 12C, 12M, and 12Y, respectively, onto the recording paper 16 while conveying the recording paper 16.

The print determination unit 24 has a line sensor for capturing an image of the ink-droplet deposition result of the printing unit 12, and functions as a device to check for ejection defects such as clogs of the nozzles in the printing unit 12 from the ink-droplet deposition results evaluated by the line sensor.

A post-drying unit 42 is disposed following the print determination unit 24. The post-drying unit 42 is a device to dry the printed image surface, and includes a heating fan, for example. It is preferable to avoid contact with the printed surface until the printed ink dries, and a device that blows heated air onto the printed surface is preferable.

A heating/pressurizing unit 44 is disposed following the post-drying unit 42. The heating/pressurizing unit 44 is a device to control the glossiness of the image surface, and the image surface is pressed with a pressure roller 45 having a predetermined uneven surface shape while the image surface is heated, and the uneven shape is transferred to the image surface.

The printed matter generated in this manner is cut to a prescribed size by the cutter 28 and then output from the paper output unit 26. The target print (i.e., the result of printing the target image) and the test print are preferably output separately. In the inkjet recording apparatus 10, a sorting device (not shown) is provided for switching the outputting pathways in order to sort the printed matter with the target print and the printed matter with the test print, and to send them to paper output units 26A and 26B, respectively. When the target print and the test print are simultaneously formed in parallel on the same large sheet of paper, the test print portion is cut and separated by a cutter (second cutter) 48.

Method for Forming Film According to Aerosol Deposition Method

Next, a method for forming film according to an aerosol deposition method as used in the manufacture of a piezoelectric actuator according to the present invention will be described below.

Figure 3:
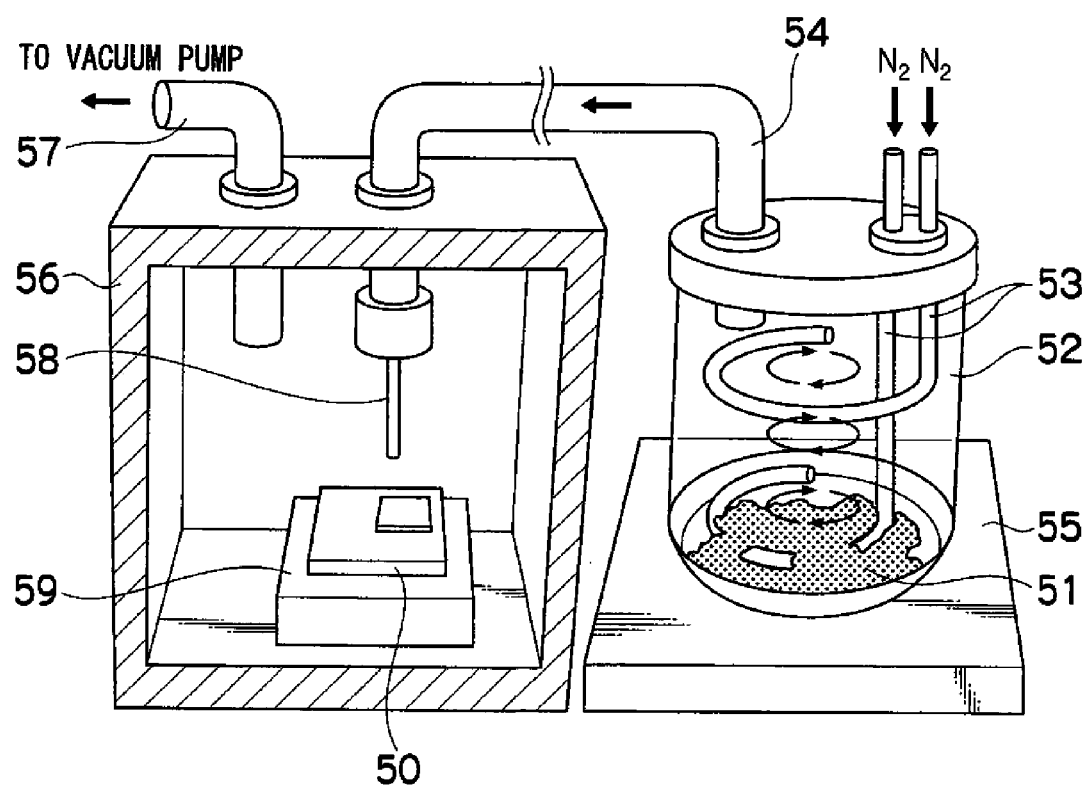
FIG. 3 is a schematic drawing showing a film formation device according to an aerosol deposition method.

FIG. 3 is a schematic drawing showing a film formation device according to the aerosol deposition method. This film formation device has an aerosol generating chamber 52 in which a raw material powder 51 is provided. Herein, the term "aerosol" includes fine particles of a solid or liquid which are suspended in a gas.

A carrier gas input section 53, an aerosol output section 54, and a vibrating unit 55 are attached to the aerosol generating chamber 52. When a gas such as nitrogen gas ($N_2$) is introduced via the carrier gas input section 53, the raw material powder is blown and lifted in the aerosol generating chamber 52, thereby generating an aerosol. In this case, if a vibration is applied to the aerosol generating chamber 52 by means of the vibrating unit 55, then the raw material powder is churned up, thereby generating an aerosol efficiently. Thus, the generated aerosol is channeled through the aerosol output section 54 to a film formation chamber 56.

An exhaust tube 57, a nozzle 58, and a movable stage 59 are provided in the film formation chamber 56. The exhaust tube 57 is connected to a vacuum pump, and evacuates the interior of the film formation chamber 56. After the aerosol is generated in the aerosol generating chamber 52 and is conducted to the film formation chamber 56 via the aerosol output section 54, the aerosol is sprayed from the nozzle 58 onto a supporting substrate 50. Hence, the raw material powder collides with the supporting substrate 50, and builds up thereon. The supporting substrate 50 is mounted on the movable stage 59 that is capable of three-dimensional movement, and hence the relative positions of the supporting substrate 50 and the nozzle 58 can be adjusted by controlling the movable stage 59.

Target Thickness of Piezoelectric Body and Supporting Substrate

In order to achieve a liquid ejection head of high density, the dimensions of the piezoelectric body are set to 300 μm square, and the dimensions of the supporting substrate (diaphragm) are set to 500 μm square.

Figure 4A:
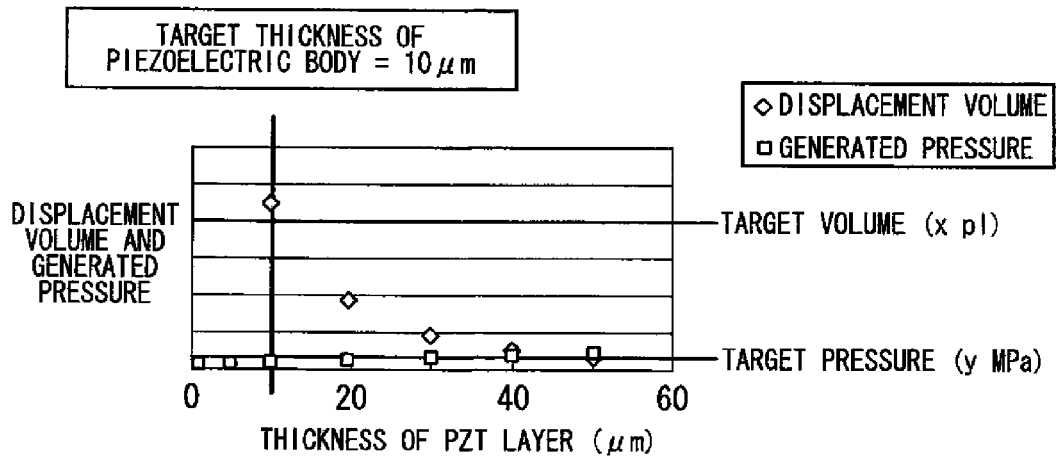
FIG. 4A is a graph showing a relationship between the thickness of a piezoelectric body made of PZT, the displacement volume, and the generated pressure.
Figure 4B:
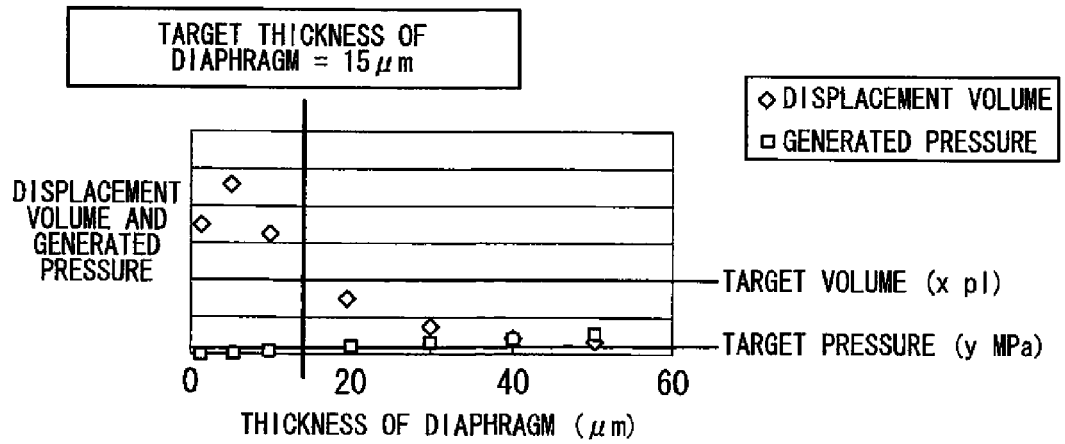
FIG. 4B is a graph showing a relationship between the thickness of a diaphragm, the displacement volume, and the generated pressure.

FIG. 4A is a graph showing a relationship between the thickness of a piezoelectric body made of lead zirconate titanate ($Pb(ZrTi)O_3$) (PZT) under the aforementioned conditions, the displacement volume, and the generated pressure. FIG. 4B is a graph showing a relationship between the thickness of a diaphragm, the displacement volume, and generated pressure.

As shown in FIG. 4A, if the liquid droplet size (target volume) of the liquid ejection head is set to x picoliters (pl) and the target pressure is set to y Megapascal (MPa), then the thickness of a PZT film is 10 μm to satisfy both the target volume and the target pressure.

Similarly, as shown in FIG. 4B, when the target volume is set to x (pl), and the target pressure is set to y (MPa), then the thickness of a diaphragm is 15 μm to satisfy both the target volume and the target pressure.

When forming PZT directly onto a diaphragm, a film can only be formed to a thickness of approximately 3 μm by the sputtering method. Therefore, it is preferably to use the aerosol deposition method in order to form the PZT film of 10 μm as described above.

Structure of Piezoelectric Actuator

As described above, when a PZT piezoelectric body having a thickness of 10 μm is formed by the aerosol deposition method on a diaphragm having a thickness of 15 μm, then a strong compressive stress acts on the actual PET piezoelectric film having a fine structure, while thermal stress also acts due to the difference between the thermal expansion coefficients of the PZT piezoelectric film and the diaphragm, and hence the diaphragm undergoes stress deformation due to the stress in the PZT piezoelectric film. Therefore, the present invention attempts to reduce the film stress in the PZT piezoelectric film (in other words, to suppress stress deformation in the diaphragm), by interposing a thermal stress controlling layer between the diaphragm and the PZT piezoelectric film along with altering the thermal expansion coefficient and thickness of this thermal stress controlling layer.

First Embodiment

Case in which Thermal Expansion Coefficient of Diaphragm is Higher than that of Piezoelectric Body In the case in which the thermal expansion coefficient of the diaphragm is higher than that of the piezoelectric body, then a thin film made of a material having a lower thermal expansion coefficient than the diaphragm (preferably, a thermal stress controlling layer (stress buffer layer) made of a material having a lower thermal expansion coefficient than the piezoelectric body) is formed previously on the diaphragm.

Figure 5:
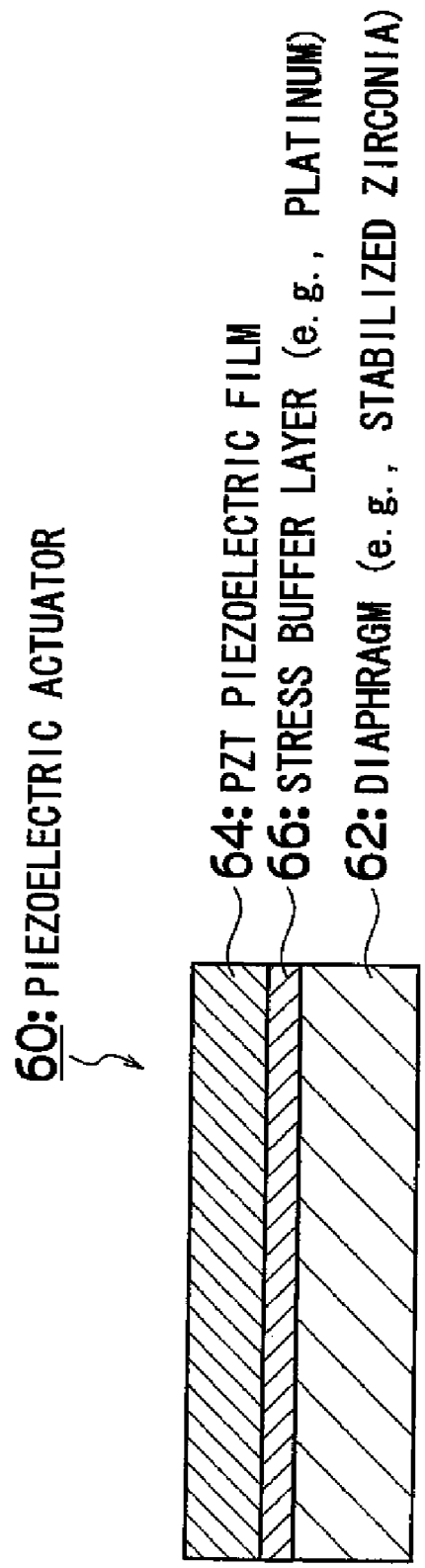
FIG. 5 is a principal cross-sectional diagram of the piezoelectric actuator according to a first embodiment of the present invention.

FIG. 5 is a principal cross-sectional diagram of a piezoelectric actuator 60 according to a first embodiment. As shown in FIG. 5, the piezoelectric actuator 60 comprises: a stabilized zirconia substrate 62 (thermal expansion coefficient: $9.9 \times 10^{-6}/°$ C.) as the diaphragm; and a PZT piezoelectric film 64 (thermal expansion coefficient: $9.5 \times 10^{-6}/°$ C.) as the piezoelectric body. The stabilized zirconia substrate (hereinafter referred to as simply "zirconia substrate") 62 can be made of calcia (CaO) stabilized zirconia ($ZrO_2$) or magnesia (MgO) stabilized zirconia, more preferably yttria ($Y_2O_3$) stabilized zirconia. A stress buffer layer 66 made of platinum (Pt) (thermal expansion coefficient: $8.8 \times 10^{-6}/°$ C.) which has a lower thermal expansion coefficient than PZT is formed between the zirconia substrate 62 and the PZT piezoelectric film 64.

The stress buffer layer 66 is formed on the zirconia substrate 62 by the sputtering method, the plating method, or the aerosol deposition method. The PZT piezoelectric film 64 is formed on the stress buffer layer 66 by the aerosol deposition method. The temperature during film formation by the aerosol deposition method is approximately 600° C.

Figure 6:
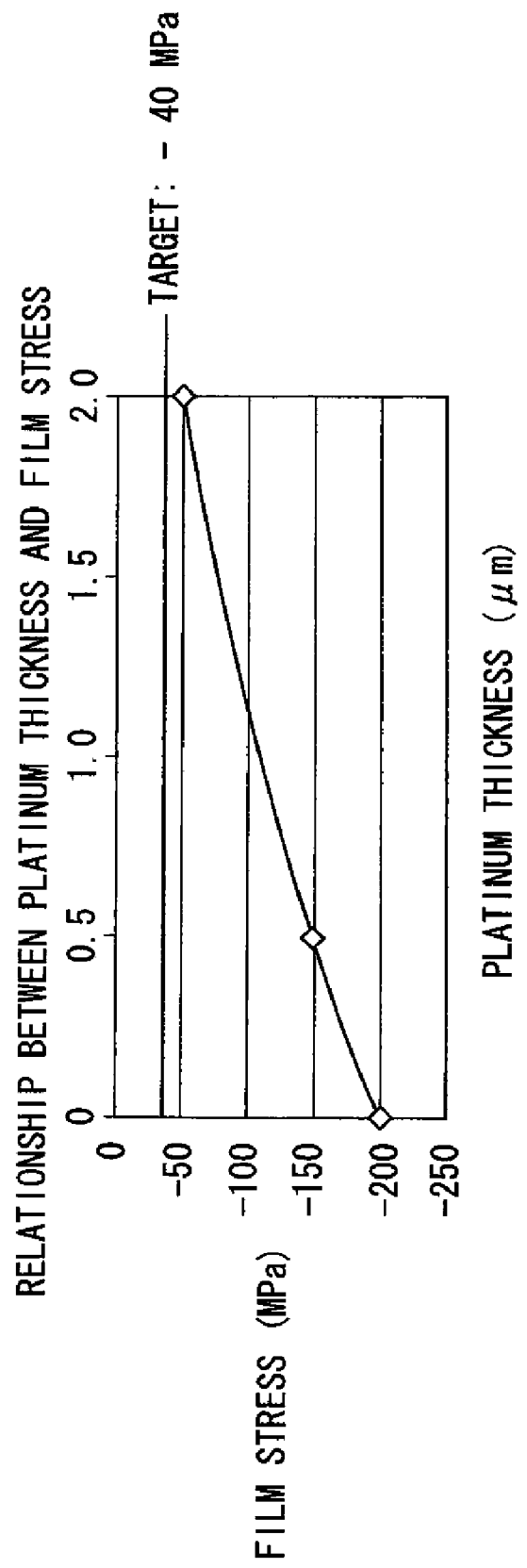
FIG. 6 is a graph showing a relationship between the film stress in the case in which a PZT piezoelectric film is formed on a zirconia substrate, and the thickness of the stress buffer layer made of platinum.

FIG. 6 is a graph showing the relationship between the film stress in the case in which a PZT piezoelectric film 64 is formed on a zirconia substrate 62, and the thickness of the stress buffer layer 66. On the graph in FIG. 6, the target film stress (40 MPa) is the target value for the film stress at which the deformation of the substrate can be kept to 10 μm (corresponding to the thickness of the adhesive) or less.

As shown on the graph in FIG. 6, when the film thickness of the stress buffer layer 66 is zero (in other words, when no stress buffer layer 66 is formed), then the film stress (compressive stress) in the PZT piezoelectric film 64 becomes a maximum. As the film thickness of the stress buffer layer 66 becomes greater, then the state approaches that of a film formed on a platinum substrate, and therefore, it is found that the actual film stress approaches a film stress corresponding to an ideal platinum substrate.

According to the graph shown in FIG. 6, it is found that the stress reaches the target film stress (−40 MPa) when the film thickness of the stress buffer layer 66 is 2 μm.

Figure 7:
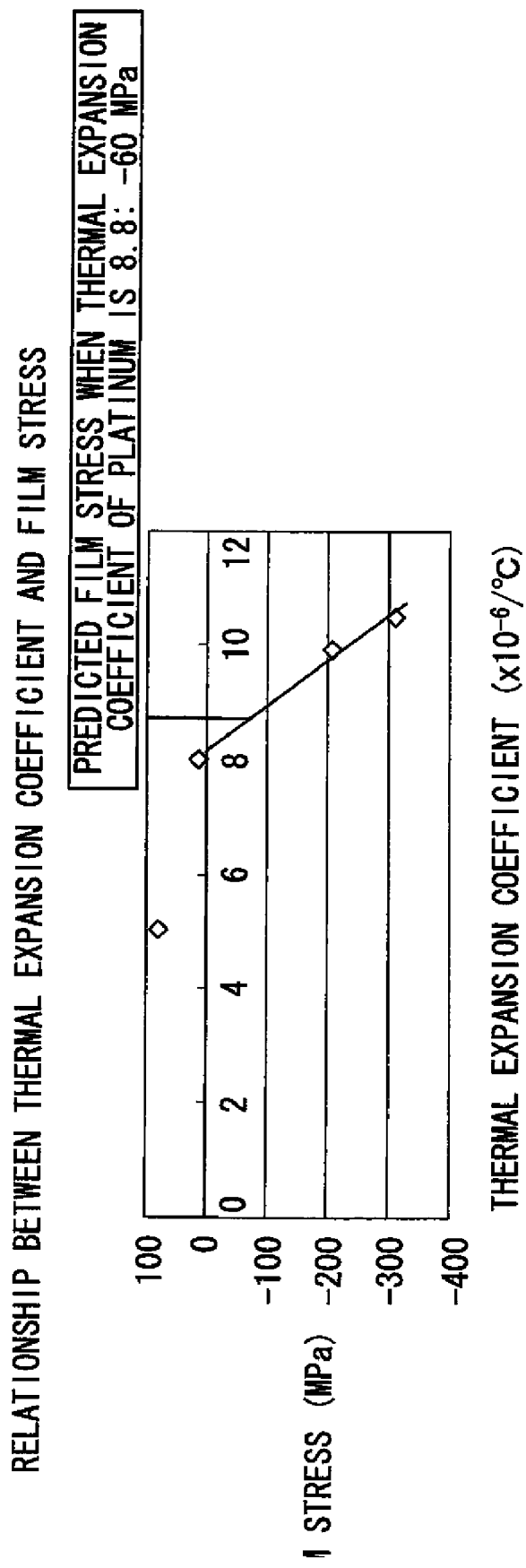
FIG. 7 is a graph showing a relationship between the thermal expansion coefficient of the diaphragm (supporting substrate) and the film stress in the PZT piezoelectric film.

On the other hand, FIG. 7 is a graph showing a relationship between the thermal expansion coefficient of the diaphragm (supporting substrate) and the film stress in the PZT piezoelectric film.

According to the graph in FIG. 7, when the thermal expansion coefficient of the supporting substrate is approximately $8 \times 10^{-6}/°$ C., then the film stress in the PZT piezoelectric film is zero. In this case, the thermal expansion coefficient of the supporting substrate (approximately, $8 \times 10^{-6}/°$ C.) is smaller than the thermal expansion coefficient of the PZT piezoelectric film (approximately, $9.5 \times 10^{-6}/°$ C.), and hence it does not match the thermal expansion coefficient of the PZT piezoelectric film. This is because a large compressive stress acts on the PZT piezoelectric film which has a fine structure formed by the aerosol deposition method, and the thermal expansion coefficient of the supporting substrate which enables the film stress in the PZT piezoelectric film to be reduced to zero is a value (approximately $8 \times 10^{-6}/°$ C.) which allows the aforementioned compressive stress to be cancelled out by thermal stress. This value is smaller than the thermal expansion coefficient of the PZT piezoelectric film.

On the graph in FIG. 7, when a supporting substrate has a thermal expansion coefficient of $8.8 \times 10^{-6}/°$ C. corresponding to that of platinum, the predicted film stress is −60 MPa. This predicted film stress virtually coincides with experimental results of a case in which a platinum stress buffer layer 66 is formed on a zirconia substrate 62.

As described above, it has been confirmed that, when the thermal expansion coefficient of the diaphragm is greater than that of the piezoelectric body, a thin film (stress buffer layer) is formed between the diaphragm and the piezoelectric body so as to have a thermal expansion coefficient which is lower than the thermal expansion coefficient of the piezoelectric body, and the thickness of this thin film is controlled, thereby being able to relieve the true stress in the piezoelectric film by means of thermal stress.

As is evident from FIG. 6, if a thickness of platinum is 2 μm, then the tensile stress caused by thermal stress is not sufficient. Therefore, the compressive stress in the PZT piezoelectric film is not cancelled out completely. If the PZT piezoelectric film 64 is formed on the zirconia substrate 62, then it is possible to in cancel out film stress effectively by introducing a stress buffer layer which has a thermal expansion coefficient lower than the coefficient ($8.8 \times 10^{-6}/°$ C.) of thermal expansion of platinum. For example, a film of iridium (Ir) having a thickness of 1 to 5 μm (thermal expansion coefficient: $6.5 \times 10^{-6}/°$ C.) is effective as a stress buffer layer.

Second Embodiment

Case in which Thermal Expansion Coefficient of Diaphragm is Lower than that of Piezoelectric Body In the case in which the thermal expansion coefficient of the diaphragm is lower than that of the piezoelectric body, a thin film made of a material having a higher thermal expansion coefficient than the diaphragm preferably, a thermal stress controlling layer (stress buffer layer) made of a material having a higher thermal expansion coefficient than the piezoelectric body) is formed previously on the diaphragm.

Figure 8:
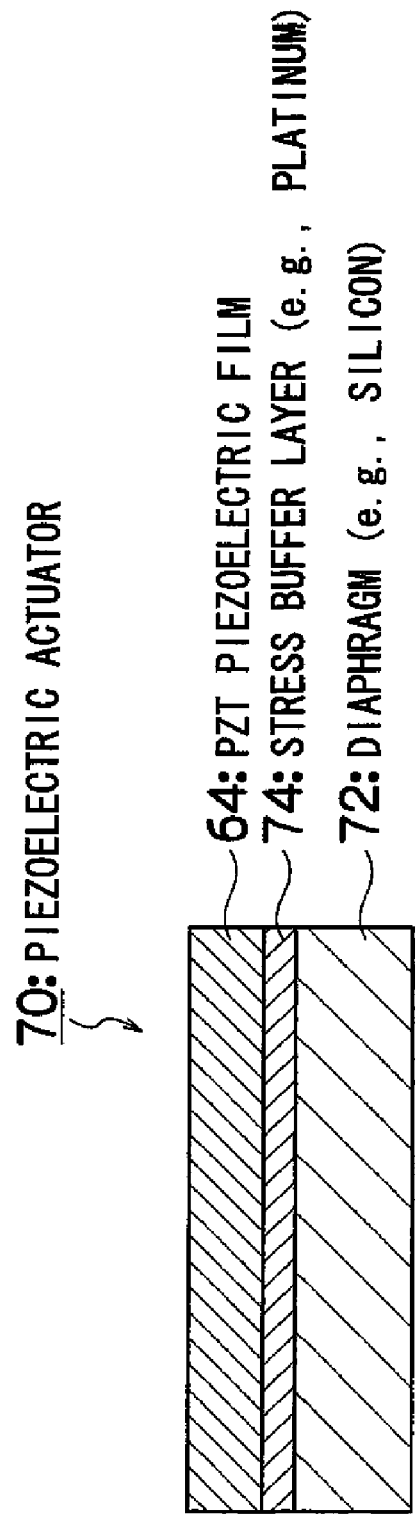
FIG. 8 is a principal cross-sectional diagram of the piezoelectric actuator according to a second embodiment of the present invention.

FIG. 8 is a principal cross-sectional diagram of a piezoelectric actuator 70 according to a second embodiment. As shown in FIG. 8, the piezoelectric actuator 70 comprises a silicon (Si) substrate 72 (thermal expansion coefficient: $3.5 \times 10^{-6}/°$ C.) as the diaphragm, and a PZT piezoelectric film 64 (thermal expansion coefficient: $9.5 \times 10^{-6}/°$ C.) as the piezoelectric body. A stress buffer layer 74 made of platinum (thermal expansion coefficient: $8.8 \times 10^{-6}/°$ C.) is formed between the silicon substrate 72 and the PZT piezoelectric film 64, which has a higher thermal expansion coefficient than silicon. Since the method for forming the stress buffer layer 74 and the PZT piezoelectric film 64 on the silicon substrate 72 is similar to that of the first embodiment shown in FIG. 5, the description thereof is omitted here.

Figure 9:
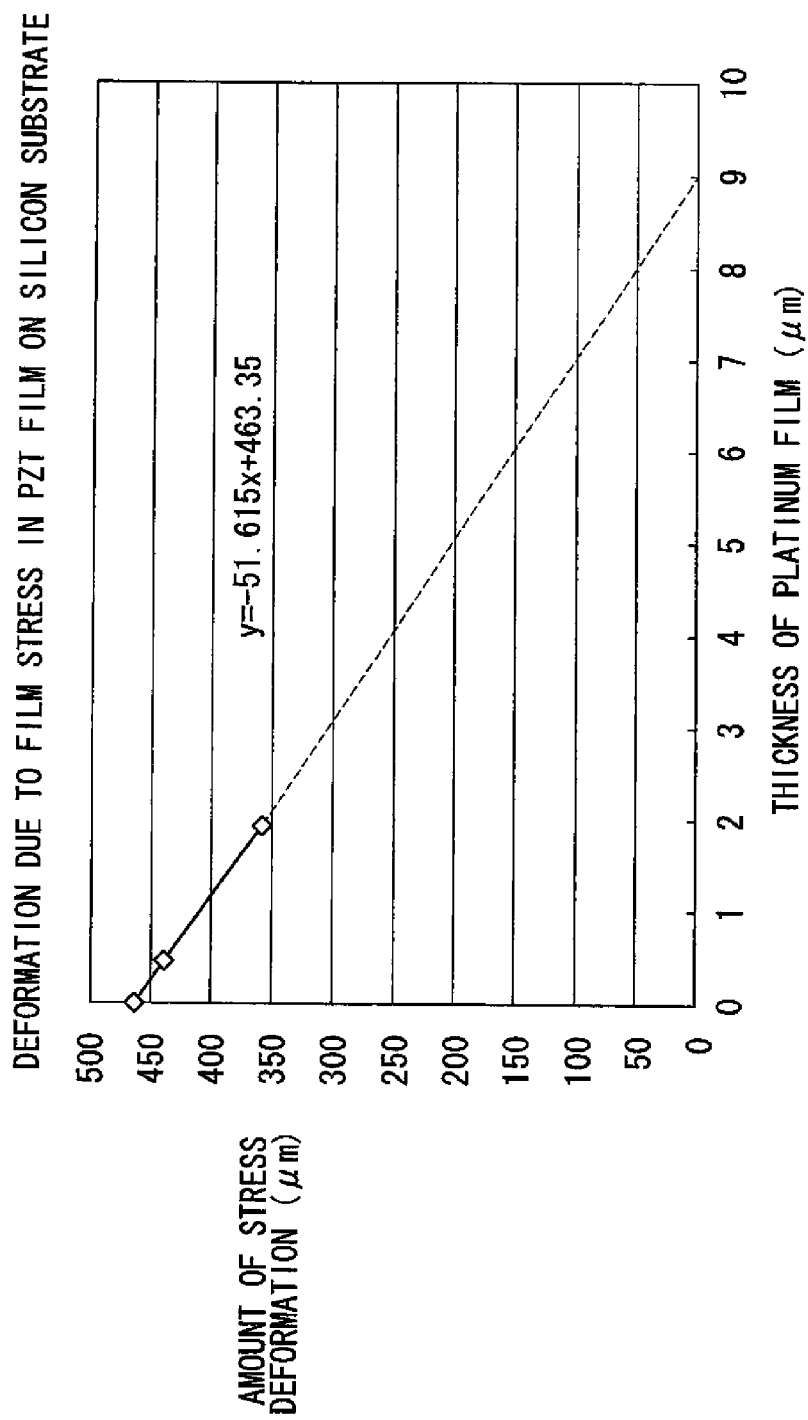
FIG. 9 is a graph showing a relationship between the film thickness of the stress buffer layer made of platinum and the amount of stress deformation in the silicon substrate, in the case in which a stress buffer layer is interposed between the silicon substrate and the PZT piezoelectric film.

FIG. 9 is a graph showing a relationship between the film thickness of the stress buffer layer 74 and the amount of stress deformation in the silicon substrate 72, in the case in which a stress buffer layer 74 is interposed between the silicon substrate 72 and the PZT piezoelectric film 64.

When a platinum stress buffer layer 74 is not formed, there is a strong tensile stress due to the thermal stress caused by a difference between the thermal expansion coefficient of the silicon substrate 72 and the thermal expansion coefficient of the PZT piezoelectric film 64, and then the amount of deformation is large. However, as the thickness of the stress buffer layer 74 increases, so the thermal expansion coefficient of the stress buffer layer 74 becomes dominant.

As shown in the graph of FIG. 9, it is found that, when the thickness of platinum stress buffer layer 74 reaches approximately 9 μm, the film stress of the PZT piezoelectric film 64 is cancelled out, and then the deformation by the film stress becomes zero.

The thermal expansion coefficient of platinum ($8.8 \times 10^{-6}$/° C.) is higher than the thermal expansion coefficient of silicon ($3.5 \times 10^{-6}$/° C.), but lower than the thermal expansion coefficient of PZT ($9.5 \times 10^{-6}$/° C.). Therefore, although a thermal stress in the compressive direction does not act on the PZT piezoelectric film 64 from the platinum stress buffer layer 74, the thermal stress in the tensile direction can be relieved effectively, in comparison with the case in which the PZT piezoelectric film 64 is formed directly onto the silicon substrate 72. As shown in FIG. 7, a strong compressive stress acts essentially on the PZT piezoelectric film 64. Therefore, when the thermal stress in the tensile direction is relieved by means of the platinum stress buffer layer 74, the compressive stress in the PZT piezoelectric film 64 can be cancelled out by means of this relieved thermal stress (tensile stress).

Furthermore, it is expected that, when a stress buffer layer constituted by a material which has a higher thermal expansion coefficient than platinum, more preferably a material having a higher thermal expansion coefficient than PZT (for example, nickel (Ni) having a thermal expansion coefficient of $13 \times 10^{-6}$/° C.), is introduced instead of the platinum stress buffer layer 74, the stress in the PZT piezoelectric film 64 can be cancelled out by a stress buffer layer which is thinner than a platinum stress buffer layer 74. More specifically, in the case in which the thermal expansion coefficient of the diaphragm is lower than that of the piezoelectric body, a stress buffer layer made of a material which has a higher thermal expansion coefficient than the piezoelectric body is formed between the diaphragm and the piezoelectric body, and the thickness of this stress buffer layer is controlled, thereby being able to cancel out the true stress in the piezoelectric film and the thermal stress to each other.

Third Embodiment

Case of Diaphragm+Stress Buffer Layer+Electrode+PZT Piezoelectric Body (i.e., a Plurality of Stress Buffer Layers)

The platinum stress buffer layers 66 and 74 shown in FIG. 5 and FIG. 8 also serve as an electrode (lower electrode) for driving the PZT piezoelectric film 64, but the stress buffer layer and the electrode may be separately functionally.

Figure 10:
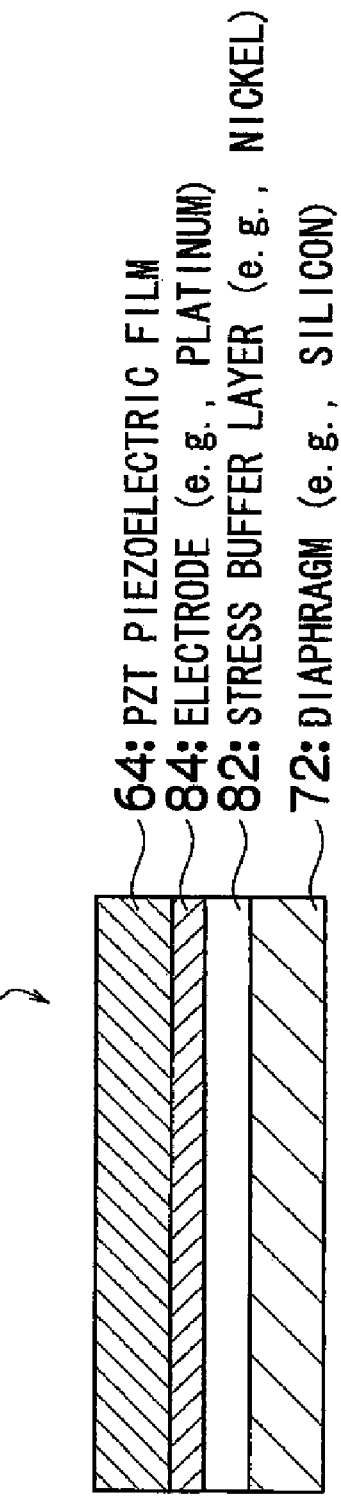
FIG. 10 is a principal cross-sectional diagram of the piezoelectric actuator according to a third embodiment of the present invention.

FIG. 10 is a principal cross-sectional diagram of a piezoelectric actuator 80 according to a third embodiment. As shown in FIG. 10, the piezoelectric actuator 80 comprises a silicon substrate 72 (thermal expansion coefficient: $3.5 \times 10^{-6}$/° C.) as the diaphragm, and a PZT piezoelectric film 64 (thermal expansion coefficient: $9.5 \times 10^{-6}$/° C.) as the piezoelectric body. A stress buffer layer 82 made of nickel (thermal expansion coefficient: $13 \times 10^{-6}$/° C.) and a platinum electrode 84 (thermal expansion coefficient: $8.8 \times 10^{-6}$/° C.) are formed between the silicon substrate 72 and the PZT piezoelectric film 64. The stress buffer layer 82 has a higher thermal expansion coefficient than PZT, and the platinum electrode 84 functions as the electrode. For example, the stress buffer layer 82 and the platinum electrode 84 are formed by the sputtering method, and the PZT piezoelectric film 64 is formed by the aerosol deposition method.

In this case, it is found that, when the film thickness of the platinum electrode 84 is in the region of 1 μm or less, the stress buffer layer 82 is dominant in controlling stress. Furthermore, it is also confirmed that there are no problems with the electrode functions in a platinum electrode 84 of 1 μm or less.

Titanium oxide (TiO$_2$) (thermal expansion coefficient: 10 to $15 \times 10^{-6}$/° C.) is another possible candidate for the stress buffer layer besides the nickel film described above, and any other material may be used for satisfying the prescribed conditions according to the thermal expansion coefficient.

Figure 11:
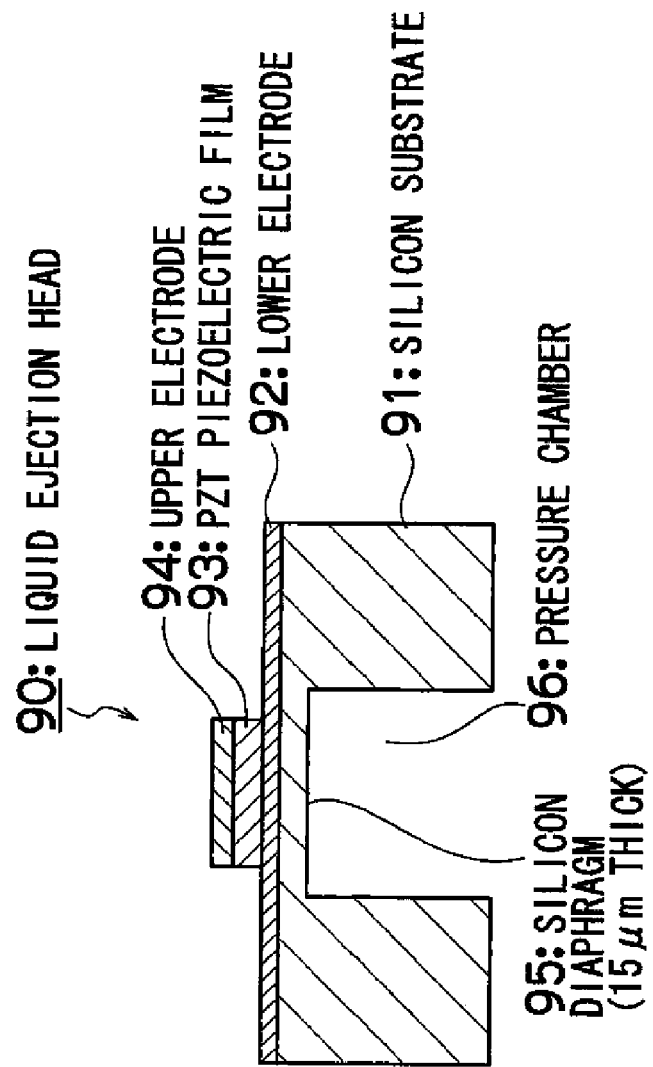
FIG. 11 is a principal cross-sectional diagram of a liquid ejection head having a piezoelectric actuator.

Manufacturing of Piezoelectric Actuator Having Aforementioned Composition and Inspection of Stress Deformation FIG. 11 is a principal cross-sectional diagram of a liquid ejection head 90 having a piezoelectric actuator of the aforementioned composition.

As shown in FIG. 11, the liquid ejection head 90 comprises: a lower electrode 92 as a stress buffer layer, which is formed on a silicon substrate 91 by the sputtering method; a PZT piezoelectric film 93 (300 μm square) which is patterned onto the lower electrode 92 by the aerosol deposition method; an upper electrode 94 which is formed on top of the PZT piezoelectric film 93; and a silicon diaphragm 95 which is formed on the opposite side to the PZT piezoelectric film 93 by etching. The spaces formed by etching the silicon diaphragm 95 are applied as a plurality of pressure chambers 96 filled with a liquid such as an ink, and the silicon substrate 91 surrounding the pressure chambers 96 is applied as the pressure chamber walls. In this case, the thickness of the silicon diaphragm 95 was set to 15 μm.

In this inspection, the PZT piezoelectric film 93 was poled by applying a DC electric field of 3 kV/mm between the lower and upper electrodes 92 and 94 of the PZT piezoelectric film 93. Then, the silicon diaphragm 95 was driven and displaced by applying a DC pulse electric field of approximately 1 kV/mm between the lower and upper electrodes 92 and 94, and a laser beam was directed onto the lower surface of the silicon diaphragm 95, thereby evaluating the operation of the piezoelectric actuator.

It was confirmed that, when no stress buffer layer was introduced, the silicon diaphragm 95 was deformed by stress in the region corresponding to the PZT piezoelectric film 93, so that there was variation in the amount of displacement. On the other hand, it was confirmed that when a stress buffer layer was introduced, the amount of displacement was stabilized between ±10%.

Quantification of Film Stress

The crystal a-axis length was evaluated by X-ray diffraction (XRD) in order to quantify the film stress in the PZT piezoelectric film (aerosol deposition film).

First, when the PZT micro-particles forming the starting material of the aerosol deposition film were evaluated by XRD in order to ascertain the stress-free state, the a-axis length was 2.034 Angstroms (Å). Next, when a bulk calcined object obtained by calcining PZT micro-particles at 1250° C. was evaluated, the a-axis length was 2.030 Å. Consequently, the a-axis length of the PZT in a stress-free state was set to be between approximately 2.025 and 2.040 Å. In other words, the average between the a-axis length (2.034 Å) of the PZT micro-particles and the a-axis length (2.030 Å) of the bulk calcined object), namely, 2.032±0.007 Å, is taken to be PZT in a stress-free state. Herein, the upper and lower limit values of the range 2.025 to 2.040 Å described above are the values at which the amount of deformation of the diaphragm becomes ±10 μm, due to the film stress of the PZT piezoelectric film. Furthermore, 10 μm is the thickness of the adhesive used to bond the diaphragm to the ink chamber walls and the like.

In the case of introducing no stress buffer layer, the a-axis length of the PZT piezoelectric film formed by the aerosol deposition method became 2.055 Å. On the other hand, in the case of an embodiment in which the film stress was reduced to 10%, it was confirmed that the a-axis length changed to 2.033 Å.

Structure of Liquid Ejection Head

Figure 12:
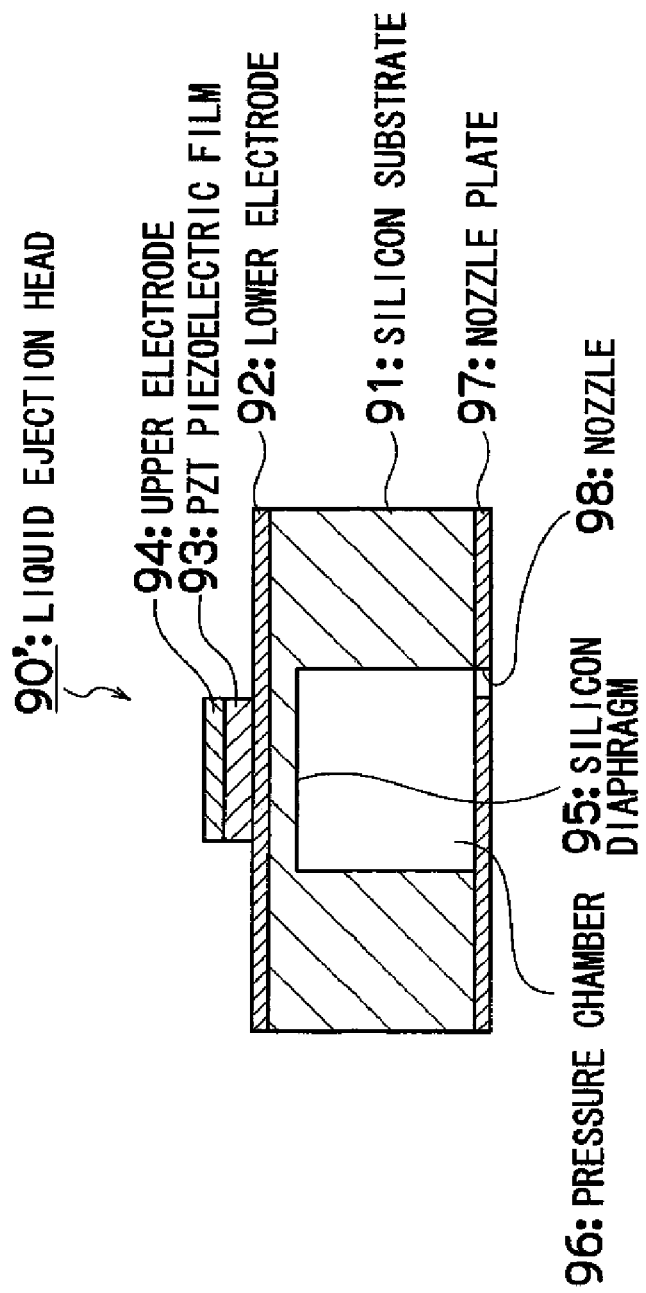
FIG. 12 is a principal cross-sectional diagram of a liquid ejection head.
Figure 13A:
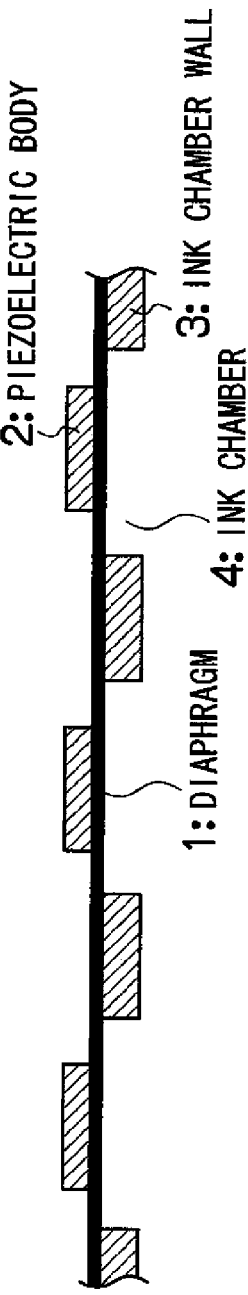
FIG. 13A is a diagram showing an ideal state in which there is no film stress in a piezoelectric body formed on a diaphragm so that there is no deformation of the diaphragm.
Figure 13B:
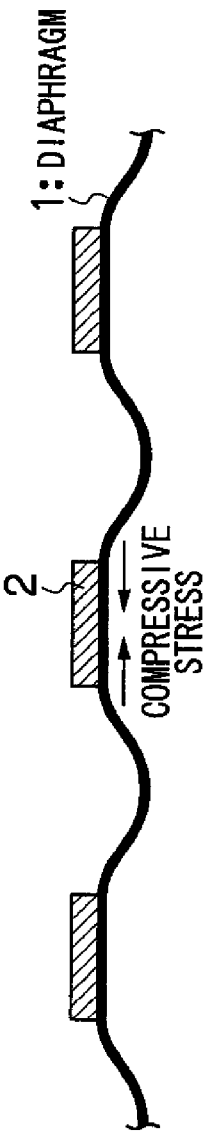
FIG. 13B is a diagram showing a state in which a compressive stress acts on the piezoelectric body and the diaphragm deforms unevenly due to the stress.

FIG. 12 is a principal cross-sectional diagram of a liquid ejection head 90'. In FIG. 12, identical reference numerals denote parts that are common to FIG. 11, and description thereof is omitted here.

As shown in FIG. 12, the liquid ejection head 90' is formed by bonding a nozzle plate 97 onto the lower surface of the silicon substrate 91 shown in FIG. 11.

A liquid (ink) is supplied via a liquid flow channel (not shown) to the pressure chambers 96. Therefore, when a silicon diaphragm 95 is displacing by driving PZT piezoelectric films 93, the liquid ejection head 90' ejects ink of a prescribed liquid droplet size from nozzles 98 formed in the nozzle plate 97.

As described above, the piezoelectric actuator according to the present invention is explained with reference to the case in which it is used as an actuator of a liquid ejection head, but it may also be used as an actuator in other devices. Furthermore, the liquid ejection head according to the present invention is used as a line-type inkjet head which ejects ink onto recording paper, but the present invention is not limited to those. It may also be applied to a shuttle-type head which moves back and forth reciprocally in a direction perpendicular to the conveyance direction of the print medium. Moreover, the liquid ejection head according to the present invention may be used as an image forming head which sprays a treatment liquid or water onto a recording medium, or may be used as a liquid ejection head for forming an image recording medium by spraying a coating liquid onto a base material.

It should be understood, however, that there is no intention to limit the invention to the specific forms disclosed, but on the contrary, the invention is to cover all modifications, alternate constructions and equivalents failing within the spirit and scope of the invention as expressed in the appended claims.

What is claimed is:

1. A piezoelectric actuator, comprising:
a supporting substrate made of silicon;
a thermal stress controlling layer which is formed on the supporting substrate, the thermal stress controlling layer being made of nickel having a thickness of 1 to 5 μm; and
a piezoelectric body which is formed as a film onto the thermal stress controlling layer on the supporting substrate at a higher temperature than room temperature,
wherein the thermal stress controlling layer reduces a film stress induced by formation of the piezoelectric body, and
wherein the thermal expansion coefficient of the thermal stress controlling layer is higher than the thermal expansion coefficient of the piezoelectric body and further wherein the thermal expansion coefficient of the piezoelectric body is higher than the thermal expansion coefficient of the supporting substrate.

2. The piezoelectric actuator as defined in claim 1, wherein the thermal stress controlling layer has a prescribed thickness required for reducing a thermal stress remaining in the piezoelectric body.

3. The piezoelectric actuator as defined in claim 1, wherein an electrode which drives the piezoelectric body is formed between the thermal stress controlling layer and the piezoelectric body.

4. The piezoelectric actuator as defined in claim 1, wherein a thickness of the supporting substrate is 30 μm or less.

5. The piezoelectric actuator as defined in claim 1, wherein a thickness of the piezoelectric body is 1 μm or greater.

6. The piezoelectric actuator as defined in claim 1, wherein:
the piezoelectric body is a PZT piezoelectric film; and
a crystal a-axis length of the PZT piezoelectric film is in the range of 2.025 to 2.040 Angstroms.

7. The piezoelectric actuator as defined in claim 6, wherein the piezoelectric body is formed by an aerosol deposition method.

8. A piezoelectric actuator, comprising:
a supporting substrate made of silicon;
a thermal stress controlling layer which is formed on the supporting substrate, the thermal stress controlling layer being made of titanium oxide having a thickness of 2 to 5 μm; and
a piezoelectric body which is formed as a film onto the thermal stress controlling layer on the supporting substrate at a higher temperature than room temperature,
wherein the thermal stress controlling layer reduces a film stress induced by formation of the piezoelectric body, and
wherein the thermal expansion coefficient of the thermal stress controlling layer is higher than the thermal expansion coefficient of the piezoelectric body and further wherein the thermal expansion coefficient of the piezoelectric body is higher than the thermal expansion coefficient of the supporting substrate.

9. A piezoelectric actuator, comprising:
a supporting substrate made of silicon;
a thermal stress controlling layer made of nickel having a thickness of 1 to 5 μm, which is formed on the supporting substrate; and
a piezoelectric body which is formed as a film onto the thermal stress controlling layer on the supporting substrate at a higher temperature than room temperature,
wherein the thermal stress controlling layer reduces a film stress induced by formation of the piezoelectric body, and
wherein an electrode which drives the piezoelectric body is formed between the thermal stress controlling layer and the piezoelectric body.

10. The piezoelectric actuator as defined in claim 9, wherein a thickness of the supporting substrate is 30 μm or less.

11. The piezoelectric actuator as defined in claim 9, wherein the thermal stress controlling layer has a prescribed thickness required for reducing a thermal stress remaining in the piezoelectric body.

12. The piezoelectric actuator as defined in claim 9, wherein a thickness of the piezoelectric body is 1 μm or greater.

13. The piezoelectric actuator as defined in claim 9, wherein:
the piezoelectric body is a PZT piezoelectric film; and
a crystal a-axis length of the PZT piezoelectric film is in the range of 2.025 to 2.040 Angstroms.

14. The piezoelectric actuator as defined in claim 13, wherein the piezoelectric body is formed by an aerosol deposition method.

15. A piezoelectric actuator, comprising:
a supporting substrate made of silicon;
a thermal stress controlling layer made of titanium oxide having a thickness of 2 to 5 μm, which is formed on the supporting substrate; and
a piezoelectric body which is formed as a film onto the thermal stress controlling layer on the supporting substrate at a higher temperature than room temperature,
wherein the thermal stress controlling layer reduces a film stress induced by formation of the piezoelectric body, and
wherein an electrode which drives the piezoelectric body is formed between the thermal stress controlling layer and the piezoelectric body.

16. A liquid ejection head, comprising:
a pressure chamber which fills with a liquid;
a nozzle which ejects the liquid from the pressure chamber; and
a piezoelectric actuator, the actuator including
a supporting substrate made of silicon;
a thermal stress controlling layer made of nickel having a thickness of 1 to 5 μm, which is formed on the supporting substrate; and
a piezoelectric body which is formed as a film onto the thermal stress controlling layer on the supporting substrate at a higher temperature than room temperature,
wherein the thermal stress controlling layer reduces a film stress induced by formation of the piezoelectric body; and
the supporting substrate is a diaphragm in which the liquid is ejected from the nozzle by changing a volume of the pressure chamber,
wherein the thermal expansion coefficient of the thermal stress controlling layer is higher than the thermal expansion coefficient of the piezoelectric body and further wherein the thermal expansion coefficient of the piezoelectric body is higher than the thermal expansion coefficient of the supporting substrate.

17. The liquid ejection head as defined in claim 16, wherein a thickness of the supporting substrate is 30 μm or less.

18. The liquid ejection head as defined in claim 16, wherein a thickness of the piezoelectric body is 1 μm or greater.

19. The liquid ejection head as defined in claim 16, wherein:
the piezoelectric body is a PZT piezoelectric film; and
a crystal a-axis length of the PZT piezoelectric film is in the range of 2.025 to 2.040 Angstroms.

20. The liquid ejection head as defined in claim 19, wherein the piezoelectric body is formed by an aerosol deposition method.

21. A liquid ejection head, comprising:
a pressure chamber which fills with a liquid;
a nozzle which ejects the liquid from the pressure chamber; and
a piezoelectric actuator, the actuator including
a supporting substrate made of silicon;
a thermal stress controlling layer made of titanium oxide having a thickness of 2 to 5 μm, which is formed on the supporting substrate; and
a piezoelectric body which is formed as a film onto the thermal stress controlling layer on the supporting substrate at a higher temperature than room temperature,
wherein the thermal stress controlling layer reduces a film stress induced by formation of the piezoelectric body; and
the supporting substrate is a diaphragm in which the liquid is ejected from the nozzle by changing a volume of the pressure chamber,
wherein the thermal expansion coefficient of the thermal stress controlling layer is higher than the thermal expansion coefficient of the piezoelectric body and further wherein the thermal expansion coefficient of the piezoelectric body is higher than the thermal expansion coefficient of the supporting substrate.

22. A liquid ejection head, comprising:
a pressure chamber which fills with a liquid;
a nozzle which ejects the liquid from the pressure chamber; and
a piezoelectric actuator, the actuator including
a supporting substrate made of silicon;
a thermal stress controlling layer made of nickel having a thickness of 1 to 5 μm, which is formed on the supporting substrate; and
a piezoelectric body which is formed as a film onto the thermal stress controlling layer on the supporting substrate at a higher temperature than room temperature,
wherein the thermal stress controlling layer reduces a film stress induced by formation of the piezoelectric body; and
the supporting substrate is a diaphragm in which the liquid is ejected from the nozzle by changing a volume of the pressure chamber,
wherein an electrode for driving the piezoelectric body is formed between the thermal stress controlling layer and the piezoelectric body.

23. The liquid ejection head as defined in claim 22, wherein a thickness of the supporting substrate is 30 μm or less.

24. The liquid ejection head as defined in claim 22, wherein a thickness of the piezoelectric body is 1 μm or greater.

25. The liquid ejection head as defined in claim 22, wherein:
the piezoelectric body is a PZT piezoelectric film; and
a crystal a-axis length of the PZT piezoelectric film is in the range of 2.025 to 2.040 Angstroms.

26. The liquid ejection head as defined in claim 25, wherein the piezoelectric body is formed by an aerosol deposition method.

27. A liquid ejection head, comprising:
a pressure chamber which fills with a liquid;
a nozzle which ejects the liquid from the pressure chamber; and
a piezoelectric actuator, the actuator including
a supporting substrate made of silicon;
a thermal stress controlling layer made of titanium oxide having a thickness of 2 to 5 μm, which is formed on the supporting substrate; and
a piezoelectric body which is formed as a film onto the thermal stress controlling layer on the supporting substrate at a higher temperature than room temperature,
wherein the thermal stress controlling layer reduces a film stress induced by formation of the piezoelectric body; and
the supporting substrate is a diaphragm in which the liquid is ejected from the nozzle by changing a volume of the pressure chamber,
wherein an electrode for driving the piezoelectric body is formed between the thermal stress controlling layer and the piezoelectric body.

28. The piezoelectric actuator as defined in claim 8, wherein the thermal stress controlling layer has a prescribed thickness required for reducing a thermal stress remaining in the piezoelectric body.

29. The piezoelectric actuator as defined in claim 8, wherein an electrode which drives the piezoelectric body is formed between the thermal stress controlling layer and the piezoelectric body.

30. The piezoelectric actuator as defined in claim 8, wherein a thickness of the supporting substrate is 30 μm or less.

31. The piezoelectric actuator as defined in claim 8, wherein a thickness of the piezoelectric body is 1 μm or greater.

32. The piezoelectric actuator as defined in claim 8, wherein:
   the piezoelectric body is a PZT piezoelectric film; and
   a crystal a-axis length of the PZT piezoelectric film is in the range of 2.025 to 2.040 Angstroms.

33. The piezoelectric actuator as defined in claim 32, wherein the piezoelectric body is formed by an aerosol deposition method.

34. The piezoelectric actuator as defined in claim 15, wherein the thermal stress controlling layer has a prescribed thickness required for reducing a thermal stress remaining in the piezoelectric body.

35. The piezoelectric actuator as defined in claim 15, wherein a thickness of the supporting substrate is 30 μm or less.

36. The piezoelectric actuator as defined in claim 15, wherein a thickness of the piezoelectric body is 1 μm or greater.

37. The piezoelectric actuator as defined in claim 15, wherein:
   the piezoelectric body is a PZT piezoelectric film; and
   a crystal a-axis length of the PZT piezoelectric film is in the range of 2.025 to 2.040 Angstroms.

38. The piezoelectric actuator as defined in claim 37, wherein the piezoelectric body is formed by an aerosol deposition method.

39. The liquid ejection head as defined in claim 21, wherein a thickness of the supporting substrate is 30 μm or less.

40. The liquid ejection head as defined in claim 21, wherein a thickness of the piezoelectric body is 1 μm or greater.

41. The liquid ejection head as defined in claim 21, wherein:
   the piezoelectric body is a PZT piezoelectric film; and
   a crystal a-axis length of the PZT piezoelectric film is in the range of 2.025 to 2.040 Angstroms.

42. The liquid ejection head as defined in claim 41, wherein the piezoelectric body is formed by an aerosol deposition method.

43. The liquid ejection head as defined in claim 27, wherein a thickness of the supporting substrate is 30 μm or less.

44. The liquid ejection head as defined in claim 27, wherein a thickness of the piezoelectric body is 1 μm or greater.

45. The liquid ejection head as defined in claim 27, wherein:
   the piezoelectric body is a PZT piezoelectric film; and
   a crystal a-axis length of the PZT piezoelectric film is in the range of 2.025 to 2.040 Angstroms.

46. The liquid ejection head as defined in claim 45, wherein the piezoelectric body is formed by an aerosol deposition method.

* * * * *